US008562872B2

(12) United States Patent
Jung et al.

(10) Patent No.: US 8,562,872 B2
(45) Date of Patent: Oct. 22, 2013

(54) PASTE FOR SOLAR CELL ELECTRODE AND SOLAR CELL PREPARED USING THE SAME

(75) Inventors: Seok Hyun Jung, Uiwang-si (KR); Jung Chul Lee, Uiwang-si (KR); Jae Hwan Oh, Uiwang-si (KR); Jae Ho Kim, Uiwang-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 192 days.

(21) Appl. No.: 13/036,473

(22) Filed: Feb. 28, 2011

(65) Prior Publication Data

US 2012/0061624 A1 Mar. 15, 2012

(30) Foreign Application Priority Data

Sep. 15, 2010 (KR) ........................ 10-2010-0090672
Dec. 8, 2010 (KR) ........................ 10-2010-0124954

(51) Int. Cl.

| | |
|---|---|
| ***H01B 1/00*** | (2006.01) |
| ***H01B 1/12*** | (2006.01) |
| ***H01B 1/02*** | (2006.01) |
| ***H01B 1/22*** | (2006.01) |
| ***H01J 1/14*** | (2006.01) |
| ***H01L 31/00*** | (2006.01) |

(52) U.S. Cl.
USPC ........ 252/519.5; 252/500; 252/512; 252/513; 252/514; 252/515; 252/519.3; 136/252; 136/256

(58) Field of Classification Search
USPC .............. 252/500, 512, 513, 514, 515, 519.3, 252/519.5; 136/252, 256
See application file for complete search history.

(56) References Cited

U.S. PATENT DOCUMENTS

| | | | | |
|---|---|---|---|---|
| 2006/0231801 | A1 | 10/2006 | Carroll et al. | |
| 2009/0104457 | A1 | 4/2009 | Carroll et al. | |
| 2009/0120483 | A1 | 5/2009 | Carroll et al. | |
| 2009/0301553 | A1 | 12/2009 | Konno et al. | |
| 2009/0301554 | A1 | 12/2009 | Konno et al. | |
| 2011/0147678 | A1 * | 6/2011 | Kim et al. | 252/519.3 |
| 2011/0203659 | A1 | 8/2011 | Carroll et al. | |

FOREIGN PATENT DOCUMENTS

EP 1713092 A2 10/2006

OTHER PUBLICATIONS

European Search Report in EP 10195259.6-1218, dated Mar. 27, 2012 (Jung, et al.).
Chinese Office Action in CN 201010597609.3, dated Mar. 5, 2013, with English translation (Jung, et al.).

* cited by examiner

*Primary Examiner* — Harold Pyon
*Assistant Examiner* — Tanisha Diggs
(74) *Attorney, Agent, or Firm* — Lee & Morse, P.C.

(57) ABSTRACT

A paste for solar cell electrodes and a solar cell using the same, the paste including a conductive powder; glass frit; an organic vehicle; and metal oxide particles, the metal oxide particles having a nanometer scale particle size distribution having an average particle diameter (D50) of about 15 nm to about 50 nm and a micron scale particle size distribution having an average particle diameter (D50) of about 0.1 μm to about 2 μm.

9 Claims, 1 Drawing Sheet

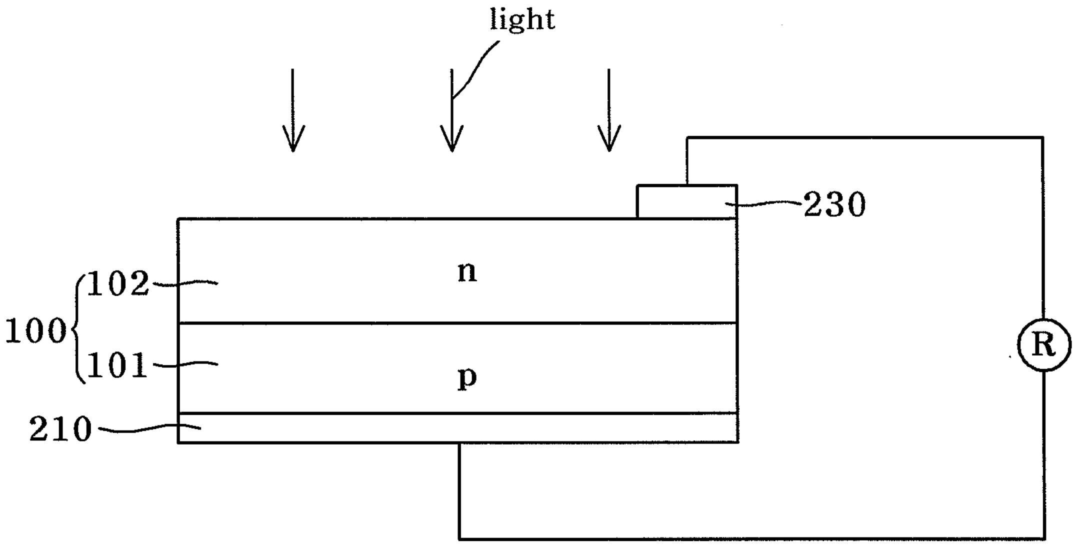
light
230
n
102
100
101
p
210
R

PASTE FOR SOLAR CELL ELECTRODE AND SOLAR CELL PREPARED USING THE SAME

BACKGROUND

1. Field

Embodiments relate to a paste for solar cell electrodes and a solar cell prepared using the same.

2. Description of the Related Art

Fossil fuels, e.g., oil and coal, are not renewable. Thus, solar cells utilizing sunlight as an alternative energy source have attracted attention. A solar cell may generate electric energy using the photovoltaic effect of a p-n junction which converts photons into electricity. In the solar cell, a front electrode and a rear electrode may be formed on a front surface and a rear surface, respectively, of a semiconductor wafer or substrate with the p-n junction. Then, the photovoltaic effect of the p-n junction may be induced by sunlight entering the wafer. Electrons generated by the photovoltaic effect of the p-n junction may provide an electric current flowing outside the solar cell through the electrodes. A standard for evaluating solar cell quality is conversion efficiency. The conversion efficiency of the solar cells is a value that indicates a conversion amount of incident light into electrical energy. The conversion efficiency may be expressed as a ratio of maximum output to incident energy.

SUMMARY

Embodiments are directed to a paste for solar cell electrodes and a solar cell prepared using the same.

The embodiments may be realized by providing a paste for solar cell electrodes, the paste including a conductive powder; a glass frit; an organic vehicle; and metal oxide particles, the metal oxide particles having a nanometer scale particle size distribution and a micron scale particle size distribution.

The metal oxide particles may include at least one of zinc oxide particles, lead oxide particles, copper oxide particles, silicon oxide particles, and titanium oxide particles.

The metal oxide particles having a nanometer scale particle size distribution may have an average particle diameter (D50) of about 15 nm to about 50 nm, and the metal oxide particles having a micron scale particle size distribution may have an average particle diameter (D50) of about 0.1 μm to about 2 μm.

The metal oxide particles having a nanometer scale particle size distribution may be present in an amount of about 5 to about 50 wt %, with respect to a total weight of the metal oxide particles.

The conductive powder may include at least one of silver, gold, palladium, platinum, copper, chromium, cobalt, aluminum, tin, lead, zinc, iron, iridium, osmium, rhodium, tungsten, molybdenum, nickel, and indium tin oxide.

The glass frit may include a leaded glass frit, a lead-free glass fit, or a mixture thereof.

The organic vehicle may include at least one of an organic binder and a solvent.

The paste may include about 60 to about 90 wt % of the conductive powder, based on a total weight of the paste, about 1 to about 10 wt % of the glass fit, based on the total weight of the paste, about 8 to about 20 wt % of the organic vehicle, based on the total weight of the paste, and about 1 to about 10 wt % of the metal oxide particles, based on the total weight of the paste.

The paste may further include an additive, the additive including at least one of a plasticizer, a dispersant, a thixotropic agent, a viscosity stabilizer, an anti-foaming agent, a pigment, a UV stabilizer, an antioxidant, and a coupling agent.

The embodiments may also be realized by providing an electrode formed from the paste for solar cell electrodes according to an embodiment.

The embodiments may also be realized by providing a solar cell including the electrode of an embodiment.

The embodiments may also be realized by providing a solar cell including an electrode, the electrode including a conductive powder; a glass frit; and metal oxide particles, the metal oxide particles having a nanometer scale particle size distribution and a micron scale particle size distribution.

BRIEF DESCRIPTION OF THE DRAWING

The above and other features and advantages will become more apparent to those of ordinary skill in the art by describing in detail exemplary embodiments with reference to the attached drawing, in which:

FIG. 1 illustrates a schematic view of a solar cell manufactured using a paste in accordance with an embodiment.

DETAILED DESCRIPTION

Korean Patent Application No. 10-2010-0090672, filed on Sep. 15, 2010, in the Korean Intellectual Property Office, and entitled: "Paste for Solar Cell Electrode and Solar Cell Using the Same," and Korean Patent Application No. 10-2010-0124954, filed on Dec. 8, 2010, in the Korean Intellectual Property Office, and entitled: "Paste for Solar Cell Electrode and Solar Cell Using the Same," are incorporated by reference herein in their entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing FIGURE, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Electrodes of a solar cell may be formed on the wafer by, e.g., applying, patterning, and burning a paste for electrodes. Characteristics of electrodes may be an important factor in improving the conversion efficiency of the solar cells. A paste for forming front electrodes configured to receive incident sunlight may include conductive particles, glass frit powders, and a vehicle provided as a liquid carrier.

According to an embodiment, a paste for solar cell electrodes may include (a) a conductive powder, (b) a glass frit, (c) an organic vehicle, and (d) nanometer and micron scale metal oxide particles.

(a) Conductive Powder

The conductive powder may include, e.g., a conductive organic material, a conductive inorganic material, or a combination thereof.

In an implementation, the conductive powder may be an inorganic powder, and preferably is a metallic powder. Examples of the inorganic conductive powder may include, but are not limited to, silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), and indium tin oxide (ITO). The conductive powder may be used alone, as an alloy of two or more kinds thereof, or in a combination of two or more kinds thereof.

In an implementation, the conductive powder may include silver (Ag) particles and may further include nickel (Ni), cobalt (Co), iron (Fe), zinc (Zn), or copper (Cu) particles.

The conductive powder may have, e.g., a spherical shape, a flake shape, an amorphous shape, or a combination thereof. In an implementation, the conductive powder may have a spherical shape to further improve fill factor, sintering density, and UV transmittance.

The conductive powder may have an average particle diameter (D50) of about 0.1 to about 10 μm, preferably about 0.2 to about 7 μm, more preferably about 0.5 to about 5 μm, and still more preferably about 1 to about 3 μm. The average particle diameter may be measured by Model 1064D (CILAS Co., Ltd.) after dispersing the conductive powder in isopropyl alcohol (IPA) with ultrasound waves at room temperature for 3 minutes.

The conductive powder may be present in an amount of about 60 to about 90 wt %, with respect to a total weight of the paste. Maintaining the amount of the conductive powder within this range may help prevent undesirable deterioration in conversion efficiency (of a solar cell having an electrode prepared using the paste) caused by an increase in resistance. Maintaining the amount of the conductive powder within this range may also help prevent difficulty in forming the paste caused by a relative reduction in amount of the organic vehicle. The conductive powder is preferably present in an amount of about 70 to about 88 wt %, and more preferably about 75 to about 82 wt %, with respect to the total weight of the paste.

(b) Glass Frit

The glass frit may enhance adhesion between the conductive powder and an underlying substrate during a burning or firing process and may be softened upon sintering to further lower a sintering temperature.

The glass fit may include a crystallized glass frit and/or non-crystallized glass frit. The glass frit may include any of a leaded glass frit, a lead-free glass frit, and a mixture thereof. For example, the glass frit may include, but is not limited to, at least one of zinc oxide-silicon oxide ($ZnO—SiO_2$), zinc oxide-boron oxide-silicon oxide ($ZnO—B_2O_3—SiO_2$), zinc oxide-boron oxide-silicon oxide-aluminum oxide ($ZnO—B_2O_3—SiO_2—Al_2O_3$), bismuth oxide-silicon oxide ($Bi_2O_3—SiO_2$), bismuth oxide-boron oxide-silicon oxide ($Bi_2O_3—B_2O_3—SiO_2$), bismuth oxide-boron oxide-silicon oxide-aluminum oxide ($Bi_2O_3—B_2O_3—SiO_2—Al_2O_3$), bismuth oxide-zinc oxide-boron oxide-silicon oxide ($Bi_2O_3—ZnO—B_2O_3—SiO_2$), and bismuth oxide-zinc oxide-boron oxide-silicon oxide-aluminum oxide ($Bi_2O_3—ZnO—B_2O_3—SiO_2—AlO_3$) glass frit.

The glass frit may have an average particle diameter (D50) of about 0.1 to about 5 μm, and preferably about 0.5 to about 3 μm. Maintaining the particle size of the glass frit at about 0.1 to about 5 μm may help ensure that curing of a deep part through UV irradiation is not interrupted and that generation of pinholes does not occur in a developing process when forming the electrodes. The average particle diameter may be measured by Model 1064D (CILAS Co., Ltd.) after dispersing the glass frit in isopropyl alcohol (IPA) with ultrasound waves at room temperature for 3 minutes.

In an implementation, the glass frit may have a transition point of about 300° C. to about 600° C., and preferably about 400° C. to about 550° C.

The glass frit may be present in an amount of about 1 to about 10 wt %, and preferably about 1 to about 7 wt %, with respect to the total weight of the paste. Maintaining the amount of the glass fit at about 1 to about 10 wt % may help prevent an undesirable deterioration in conversion efficiency (of a solar cell prepared using the paste) due to an improvement in resistance, sintering properties, and adhesion of the conductive powder. Maintaining the amount of the glass frit at about 1 to about 10 wt % may also help prevent an excessive amount of glass frit from remaining after burning, which may cause an undesirable increase in resistance and deterioration in wettability.

(c) Organic Vehicle

The organic vehicle may include an organic binder and may provide liquid properties to the paste. In an implementation, the organic vehicle (c) may include an organic binder and a solvent. For example, the organic vehicle (c) may include about 5 to about 40 wt % of the organic binder and about 60 to about 95 wt % of the solvent, with respect to a total weight of the organic vehicle. In another implementation, the organic vehicle (c) may include about 5 to about 30 wt % of the organic binder and about 70 to about 95 wt % of the solvent, with respect to the total weight of the organic vehicle.

Examples of the organic binder may include, but are not limited to, acrylic polymers obtained by copolymerization with hydrophilic acrylic monomers such as a carboxyl group; cellulose polymers, such as ethyl cellulose, hydroxyethyl cellulose, hydroxypropyl cellulose, and hydroxyethyl hydroxypropyl cellulose, and the like. The binders may be may be used alone or in a mixture of two or more kinds thereof.

The solvent may include an organic solvent having a boiling point of about 120° C. or more. Examples of the solvent may include, but are not limited to, methyl cellosolve, ethyl cellosolve, butyl cellosolve, aliphatic alcohol, α-terpineol, β-terpineol, dihydro-terpineol, ethylene glycol, ethylene glycol mono butyl ether, butyl cellosolve acetate, texanol, etc. The solvents may be used alone or in a mixture of two or more kinds thereof.

The organic vehicle may be present in an amount of about 8 to about 20 wt %, and preferably about 10 to about 15 wt %, with respect to the total weight of the paste. Maintaining the amount of the organic vehicle at about 8 to about 20 wt % may help prevent inefficient dispersion and/or an excessive increase in viscosity after preparation of the paste, (which may lead to printing difficulty). Maintaining the amount of the organic vehicle at about 8 to about 20 wt % may also help prevent an undesirable increase in resistance and other problems that may occur during the burning process.

(d) Metal Oxide Particles

The metal oxide particles may improve contact resistance of electrodes (prepared using the paste) and may promote crystallization of the paste.

The metal oxide particles may include, but are not limited to, zinc oxide (ZnO), lead oxide (PbO), copper oxide (CuO), silicon oxide ($SiO_2$), and titanium oxide ($TiO_2$).

The metal oxide particles may include a mixture of particles having a nanometer scale average particle diameter (D50) and particles having a micron scale average particle diameter (D50). In an implementation, the particles having a nanometer scale average particle diameter may have an average particle diameter (D50) of about 15 to about 50 nm, and preferably about 20 to about 40 nm. In an implementation, the particles having a micron scale average particle diameter may have an average particle diameter (D50) of about 0.1 to about 2 μm, preferably about 0.1 to about 1.5 μm. The average particle diameter may be measured by Model 1064D (CILAS Co., Ltd.) after dispersing the metal oxide particles in isopropyl alcohol (IPA) with ultrasound waves at room temperature for 3 minutes. Within this range, the paste may have good fill factor and characteristics desirable for good conversion efficiency.

The metal oxide particles (including the particles having a nanometer scale average particle diameter and the particles having a micron scale average particle diameter) may be present in an amount of about 1 to about 10 wt %, and preferably, in an amount of about 1 to about 8 wt %, with respect to the total weight of the paste. Within this range, it is possible to prevent deterioration in resistance and conversion efficiency (in a solar cell prepared using the paste) caused by a deterioration in sintering properties during the burning process and may also help prevent poor printing caused by an increase in resistance and viscosity of the paste.

The nanometer scale particles may be present in an amount of about 5 to about 50 wt %, preferably about 25 to about 50 wt %, and still more preferably about 25 to about 40 wt %, with respect to the total weight of the metallic oxide particles. Maintaining the amount of the nanometer scale particles at about 5 to about 50 wt % may help ensure that a specific surface area and volume of the metal oxide particles increases (to provide more spaces for reaction with the glass frit), thereby providing desirable effects.

Additive

The paste for solar cell electrodes may further include an additive, as desired, to enhance, e.g., flow properties, process properties, and stability. The additive may include, but is not limited to, a plasticizer, a dispersant, a thixotropic agent, a viscosity stabilizer, an anti-foaming agent, a pigment, a UV stabilizer, an antioxidant, a coupling agent, etc. The additive may be used alone or as a mixture of two or more kinds thereof.

The additives may be included in an amount of about 0.1 to about 5 wt %, with respect to the total weight of the paste. However, the embodiments are not limited thereto, and the amount may be changed, as desired.

The embodiments also provide an electrode formed using the paste for solar cell electrodes and a solar cell including the same. FIG. 1 illustrates a schematic view of a solar cell manufactured using a paste in accordance with an embodiment.

Referring to FIG. 1, a rear electrode 210 and a front electrode 230 may be formed by printing (and then burning) the paste of an embodiment on a wafer or substrate 100 that includes a p-layer 101 and an n-layer 102, (which will serve as an emitter). For example, a preliminary process for preparing the rear electrode 210 may include printing or depositing the paste on a rear surface of the wafer 100 and drying the printed paste at about 200° C. to about 400° C. for about 10 to about 60 seconds. A preliminary process for preparing the front electrode 230 may include printing or depositing the paste on a front surface of the wafer 100 and drying the printed paste. Then, the front electrode 230 and the rear electrode 210 may be formed by burning or firing the wafer 100 at about 400° C. to about 900° C. for about 30 to about 50 seconds.

EXAMPLES

The following Examples, Comparative Examples (C.E.), and experiments are given for illustrative purposes only and are not intended to limit the scope of this disclosure. Moreover, the Comparative Examples are set forth to highlight certain characteristics of certain embodiments and are not to be construed as either limiting the scope of the invention as exemplified in the Examples or as necessarily always being outside the scope of the invention in every respect.

Elaboration of details apparent to those skilled in the art will be omitted herein for clarity.

Specifications of components used in the following Examples and Comparative Examples were as follows:

(a) Conductive powder: Spherical Ag powder having an average particle diameter (D50) of 2.0 μm (AG-4-8, Dowa HighTech Co., Ltd.)

(b) Glass Fit (b1) Low melting-point leaded glass frit having an average particle diameter of 1.0 μm and transition point of 451° C. (Leaded Glass, PSL1004C, Particlogy Co., Ltd.)

(b2) Low melting-point lead-free glass frit having an average particle diameter of 1.7 μm and a transition point of 317° C. (CSF-6, Phoenix PDE)

(c) Organic vehicle: ethyl cellulose (Dow Chemical Co., Ltd., STD4) dissolved at 60° C. in terpineol (Nippon Terpine Co., Ltd.)

(d) Metal Oxide Particle (d1) ZnO powder (Kanto Chemical Co., Ltd.) having an average particle diameter (D50) of 1.2 μm (d2) ZnO powder (SB Chemical Co., Ltd.) having an average particle diameter (D50) of 30 nm

Examples 1 to 4

With the aforementioned ingredients prepared in amounts (parts by weight) shown in Table 1, 0.3 parts by weight of a dispersant BYK111 (BYK-chemie), 0.3 parts by weight of a thixotropic agent BYK430 (BYK-chemie), and 0.1 parts by weight of an anti-foaming agent BYK053 (BYK-chemie) were further added thereto and mixed therewith, followed by milling using a 3-roll mill, thereby preparing pastes for solar cell electrodes.

Comparative Example 1

The same process as in Example 1 was carried out except that the nanometer scale metal oxide particles were not used.

Comparative Example 2

The same process as in Example 1 was carried out except that the micron scale metal oxide particles were not used.

TABLE 1

| | | Example 1 | Example 2 | Example 3 | Example 4 | C.E. 1 | C.E. 2 |
|---|---|---|---|---|---|---|---|
| Conductive powder | Ag particle | 80 | 80 | 80 | 80 | 80 | 80 |
| Glass frit | Leaded | 3 | 3 | 3 | — | 3 | 3 |
| Glass frit | Lead-free | — | — | — | 3 | — | — |
| Vehicle | ethyl cellulose | 1 | 1 | 1 | 1 | 1 | 1 |
| | terpineol | 11.3 | 11.3 | 13.3 | 11.3 | 11.3 | 11.3 |
| Metal oxide particle | ZnO (30 nm) | 1 | 2 | 0.5 | 1 | — | 4 |
| Metal oxide particle | ZnO (1.2 μm) | 3 | 2 | 1.5 | 3 | 4 | — |
| Additive | Dispersant | 0.3 | 0.3 | 0.3 | 0.3 | 0.3 | 0.3 |
| Additive | Thixotropic agent | 0.3 | 0.3 | 0.3 | 0.3 | 0.3 | 0.3 |
| Additive | Anti-foaming agent | 0.1 | 0.1 | 0.1 | 0.1 | 0.1 | 0.1 |
| | total | 100 | 100 | 100 | 100 | 100 | 100 |

Each of the pastes for solar cell electrodes prepared according to Examples 1 to 4 and Comparative Examples 1 and 2 was deposited in a predetermined pattern on a front surface of a wafer by screen printing and then dried in a UV furnace. Then, an aluminum paste was printed over a rear surface of the wafer and dried by the same method. Solar cells prepared by this process were subjected to a burning process at 400° C. to 900° C. for 30 to 50 seconds using a belt type furnace. Fill factor (FF, %) and conversion efficiency (Eff., %) of each solar cell were measured using CT-801 (Pasan, Co., Ltd.). The results are shown in Table 2, below.

TABLE 2

| | Example 1 | Example 2 | Example 3 | Example 4 | C.E. 1 | C.E. 2 |
|---|---|---|---|---|---|---|
| FF (%) | 74.1 | 71.5 | 60.872.2 | 73.15 | 60.8 | 51.3 |
| Eff. (%) | 17.1 | 16.675 | 13.316.625 | 17.005 | 13.3 | 11.21 |

As may be seen in Table 2, the pastes prepared by mixing the leaded or lead-free glass frit with nanometer scale and micron scale zinc oxide particles exhibited superior fill factors and conversion efficiency.

Without being bound by theory, such an improvement in fill factor and conversion efficiency is believed to be due to promotion of paste crystallization by the glass fit and zinc oxide powder during a cooling process (after drying and sintering the paste printed on the front and rear sides of the silicon wafer). Thus, the paste may be crystallized on a layer (or an emitter layer) of the silicon wafer to advantageously prevent silver (Ag) ions from entering the silicon wafer and to improve surface distribution of the silver ions.

When the nanometer scale zinc oxide particles were mixed in an amount of 5 to 50 wt %, with respect to the total weight of zinc oxide particles, the specific surface area and volume of the metal oxide particles increased (to provide more spaces for reacting with the glass frit), thereby providing desirable effects. However, when the amount of the nanometer scale zinc oxide particles exceeded 50 wt %, with respect to the total weight of zinc oxide particles, the metal oxide particles caused a rapid increase in viscosity of the paste and in pattern loss resulting from poor printability (due to excessive increase in specific surface area and volume), thereby causing significant deterioration in fill factor and conversion efficiency.

By way of summation and review, Ag ions may penetrate a silicon wafer during sintering (after printing and drying a solar cell paste on front and rear sides of the wafer). Thus, the prepared solar cell may suffer deterioration in series and parallel resistance due to low distribution of ions on the electrode and the conversion efficiency of the solar cell may not be significantly improved.

Using 7 to 100 nm average diameter zinc oxide powder may undesirably result in, e.g., an increase in viscosity of pastes, pattern losses due to poor printability, and a decrease in conversion efficiency.

Thus, the embodiments provide a paste for solar cell electrodes, the paste including nanometer and micron scale metal oxide particles and exhibiting superior printability and characteristics that help ensure superior conversion efficiency.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A paste for solar cell electrodes, the paste comprising:

a conductive powder;

a glass frit;

an organic vehicle; and metal oxide particles, the metal oxide particles having a nanometer scale particle size distribution having an average particle diameter (D50) of about 15 nm to about 50 nm and a micron scale particle size distribution having an average particle diameter (D50) of about 0.1 μm to about 2 μm; wherein the metal oxide particles having the nanometer scale particle size distribution include zinc oxide, and the metal oxide particles having the micron scale particle size distribution include zinc oxide.

2. The paste as claimed in claim 1, wherein the metal oxide particles having a nanometer scale particle size distribution are present in an amount of about 5 to about 50 wt %, with respect to a total weight of the metal oxide particles.

3. The paste as claimed in claim 1, wherein the conductive powder includes at least one of silver, gold, palladium, platinum, copper, chromium, cobalt, aluminum, tin, lead, zinc, iron, iridium, osmium, rhodium, tungsten, molybdenum, nickel, and indium tin oxide.

4. The paste as claimed in claim 1, wherein the glass frit includes a leaded glass frit, a lead-free glass frit, or a mixture thereof.

5. The paste as claimed in claim 1, wherein the organic vehicle includes at least one of an organic binder and a solvent.

6. The paste as claimed in claim 1, wherein the paste includes:

about 60 to about 90 wt % of the conductive powder, based on a total weight of the paste, about 1 to about 10 wt % of the glass frit, based on the total weight of the paste, about 8 to about 20 wt % of the organic vehicle, based on the total weight of the paste, and about 1 to about 10 wt % of the metal oxide particles, based on the total weight of the paste.

7. The paste as claimed in claim 1, further comprising an additive, the additive including at least one of a plasticizer, a dispersant, a thixotropic agent, a viscosity stabilizer, an anti-foaming agent, a pigment, a UV stabilizer, an antioxidant, and a coupling agent.

8. An electrode formed from the paste for solar cell electrodes as claimed in claim 1.

9. A solar cell comprising the electrode as claimed in claim 8.

* * * * *